United States Patent
Chung et al.

(10) Patent No.: US 7,432,578 B1
(45) Date of Patent: Oct. 7, 2008

(54) CMOS IMAGE SENSOR WITH ENHANCED PHOTOSENSITIVITY

(75) Inventors: Shine Chung, Taipei Hsien (CN);
Shou-Gwo Wuu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/739,650

(22) Filed: Apr. 24, 2007

(51) Int. Cl.
*H01L 31/06* (2006.01)
*H01L 31/0232* (2006.01)

(52) U.S. Cl. .............. 257/461; 257/436; 257/463; 257/E31.057; 257/E31.084

(58) Field of Classification Search ........... 257/436, 257/461, 463, E21.057, E31.084
See application file for complete search history.

(56) References Cited

U.S. PATENT DOCUMENTS

| | | | |
|---|---|---|---|
| 5,449,922 A | | 9/1995 | Shen et al. ............. 257/25 |
| 5,449,923 A | * | 9/1995 | Kuo et al. .............. 257/53 |
| 6,160,282 A | * | 12/2000 | Merrill ................. 257/292 |
| 6,455,908 B1 | * | 9/2002 | Johnson et al. ......... 257/440 |
| 7,049,181 B2 | | 5/2006 | Hoag et al. ............ 438/133 |
| 2005/0221517 A1 | * | 10/2005 | Speyer et al. .......... 438/24 |

OTHER PUBLICATIONS

Oike, Yusuke, "A CMOS Image Sensor for High-Speed Active Range Finding Using Column-Parallel Time-Domain ADC and Position Encoder", IEEE Transaction on Electron Devices, vol. 50, No. 1, (Jan. 2003), pp. 152-158.

* cited by examiner

*Primary Examiner*—Ngan Ngo
(74) *Attorney, Agent, or Firm*—K & L Gates LLP

(57) ABSTRACT

A photosensitive device is disclosed which comprises a semiconductor substrate, at least one reverse biased device, such as a P-N junction diode formed in the semiconductor substrate, and at least one photosensitive layer disposed above the semiconductor substrate and substantially covering the reverse biased device, the photosensitive layer releasing electrons and holes when struck by photons, wherein the photon generated electrons and holes in the photosensitive layer reach the reverse biased device and create a combination current therein when a light shines thereon.

20 Claims, 5 Drawing Sheets

CMOS IMAGE SENSOR WITH ENHANCED PHOTOSENSITIVITY

BACKGROUND

The present invention relates generally to semiconductor image sensors and more particularly to an image sensor structure with enhanced photosensitivity.

In the 1950s, researchers found that a fully charged reverse-biased P-N junction would discharge at a rate proportional to the light it received. This is because photons (light) can assist electrons and holes overcome the energy gap. These electron-hole pairs incur discharging current when they recombine after their lifetimes expire. As a result, the P-N junctions can be used as a solid-state image sensor to replace vacuum tube devices with photomultipliers to detect radiations. A CMOS image sensor, which comprises arrays of active MOS image sensor cells that are produced in a CMOS process, is one of the typical image sensing devices that utilize the photoconductive characteristics of the reverse-biased P-N junction structure.

FIG. 1 illustrates a conventional 3T CMOS image sensor cell 100 which comprises a P-N junction diode 110, a reset NMOS transistor 120, an amplifier NMOS transistor 130 and a row select NMOS transistor 140. The P-N junction diode 110, which serves as a photo-detector, and the reset NMOS transistor 120 are serially connect between a power supply VRST and a ground (GND). When the reset MOS transistor 120 is turned on by the RST signal, the P-N junction diode 110 is effectively connected to the VRST and reverse biased. When light shines on the P-N junction diode 110, an additional combination current generated by photon created electron-hole pairs cause a voltage drop at node VC. The voltage drop is then amplified by the NMOS transistor 130, which has a power supply VDD. However, the VDD is traditionally tied to the VRST. The row select NMOS transistor 140 is coupled between the amplifier NMOS transistor 130 and a column line (COL). A row line (ROW) is connected to a gate of the NMOS transistor 140. Therefore, the row select NMOS transistor 140 is a switch that allows a signal row of an array the CMOS image sensor cells 100 to be read by a read-out circuit. The aforementioned combination current flowing through the P-N junction diode 110 is proportional to the intensity of the light, therefore the read-out voltage and/or current at the COL is also proportional to the intensity of the light.

FIG. 2 is a cross-sectional view of such CMOS image sensor 100 forming an array of cells 200 in a semiconductor substrate 210. The P-N junction diode 110 and NMOS transistors 120, 130 and 140 are formed in the substrate 210. A passivation layer 220 is applied on the substrate 210. Then a planarization layer 230 is processed on top of the passivation layer 220 to make the semiconductor surface flat, for subsequent applications of a color filter 240, a spacer 250 and micro-lenses 260. All these layers 220 through 260 merely pass the light to the substrate 210, where the P-N junction diode 110 is the only device that has the photoconductive effect. Therefore, the conventional CMOS image sensor cell 200 has only mediocre optical sensitivity and signal-to-noise ratio.

As such, what is needed is an improved image sensor cell structure that has enhanced photosensitivity.

SUMMARY

The present invention discloses a CMOS image sensor with enhanced photosensitivity. In one embodiment of the present invention, the CMOS image sensor has a photosensitive device, which includes a semiconductor substrate, at least one reverse biased device, such as a P-N junction diode formed in the semiconductor substrate, and at least one photosensitive layer disposed above the semiconductor substrate and substantially covering the reverse biased device, the photosensitive layer releasing electrons and holes when struck by photons, wherein the photon generated electrons and holes in the photosensitive layer reach the reverse biased device and create a combination current therein when a light shines thereon. In another embodiment of the present invention, the photosensitive device further includes a transparent insulation layer interposed between the photosensitive layer and the semiconductor substrate.

The construction and method of operation of the invention, however, together with additional objects and advantages thereof will be best understood from the following description of specific embodiments when read in connection with the accompanying drawings.

DESCRIPTION

This invention describes a CMOS image sensor cell with a photoconductive layer for improving its sensitivity to a change of illumination. The following merely illustrates the various embodiments of the present invention for purposes of explaining the principles thereof. It is understood that those skilled in the art will be able to devise various equivalents that, although not explicitly described herein, embody the principles of this invention.

Figure 1:
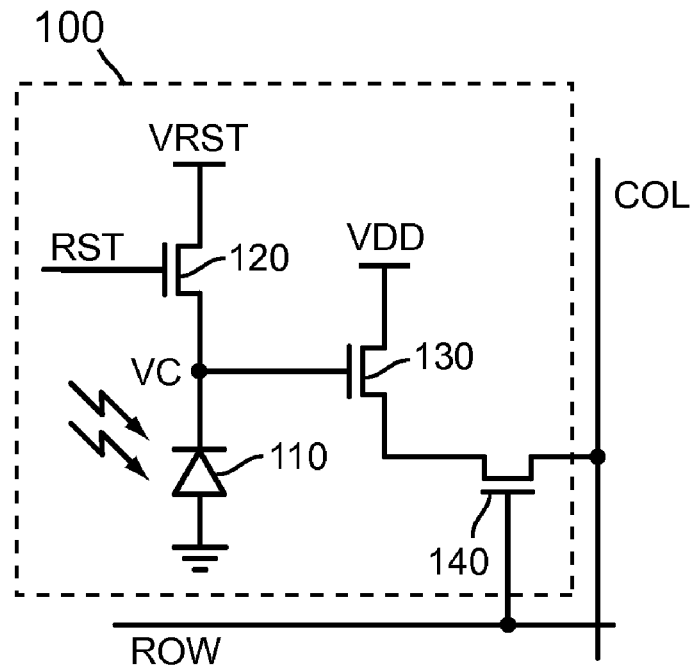
FIG. 1 is a schematic diagram illustrating a conventional CMOS image sensor cell.
Figure 3A:
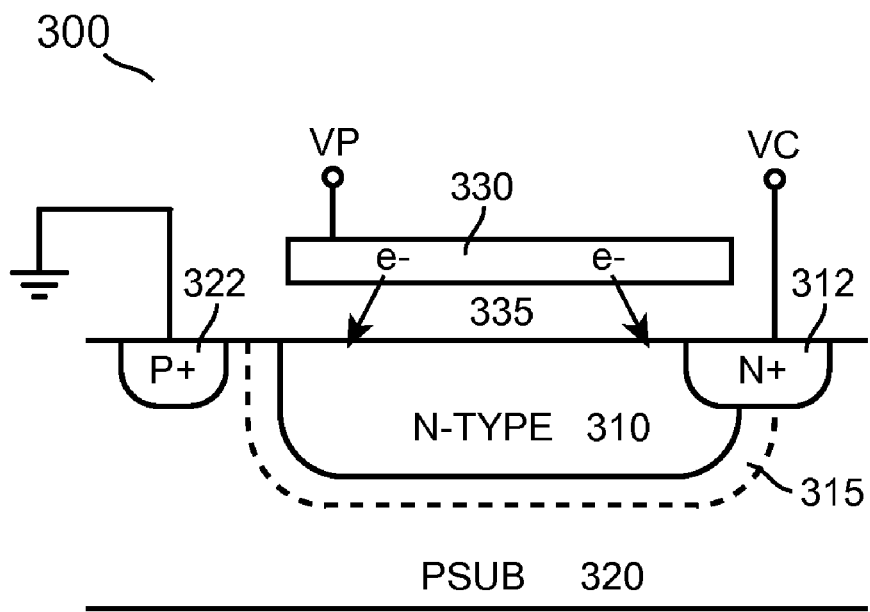
FIGS. 3A and 3B are cross-sectional views of photosensitive P-N junction diodes according to embodiments of the present invention.
Figure 3B:
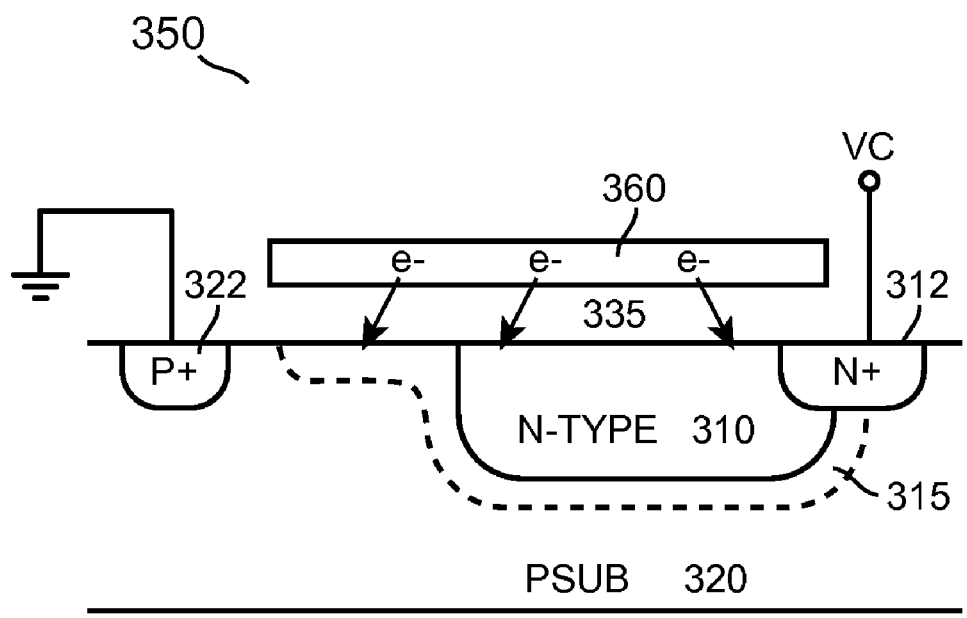

FIGS. 3A and 3B are cross-sectional views of P-N junction diodes 300 and 350 covered by photo sensitive thin films 330 and 360 according to embodiments of the present invention. Here the photo sensitive or photo conductive means extra carriers are generated when light is radiated into the film 330 and 360. Referring to FIG. 3A, the P-N junction diode comprises an N-type region 310 disposed inside a P-type semiconductor substrate (Psub) 320. An N+ region 312 serves as a pick-up for the N-type region 310. A P+ region 322 serves as a pick-up for the Psub 320. If the P-N junction is equivalent to the diode 110 of FIG. 1, then the Psub 320 is coupled to a ground (GND) through the P+ region 322, and the N-type region 310 is coupled to node VC through the N+ region 312. When light (photon) shines on the P-N junction 300, electrons and holes will be generated in the N-type region 310, and then combined in a photon collection region 315. A combination current will then be the CMOS sensor cell 100 shown in FIG. 1.

Referring to FIG. 3A, through a thin oxide layer 335, the N-type region 310 is coated by the photo sensitive thin film 330, which serves two purposes. A first purpose is to convert incoming invisible lights, such as X-ray or UV, into visible light, as CMOS image sensors are typically designed to sense only visible lights. When the invisible lights shine on the photo sensitive thin film 330, electrons in the thin film 330 are incited into higher energy levels by the incoming photons and then emit other photons after falling back into the ground states. In case of converting X-ray, the thin film 330 is made of phosphor. When the incoming X-ray light (photon) strikes the phosphor layer 330, it will be converted into a visible wavelength, so that the P-N junction diode 300 can sense the incoming X-ray light. One having ordinary skills in the art would choose other materials for the thin film 330 when other incoming lights need to be converted.

A second purpose of the photo sensitive thin film 330 is to generate electron-hole pairs when light shines on it. These generated electrons and holes will then tunnel through the thin oxide 335 and induce more combinations of electrons and holes in the photon collection region 315. According to the embodiments of the present invention, the thin film 330 is made of a semiconductor material, such as phosphor, it is therefore transparent to light. Meanwhile the thin oxide 335 is also transparent. Both the photo sensitive thin film 330 and the P-N junction itself can generate electron-hole pairs when shined by light, therefore current generation efficiency of the P-N junction diode 300 is improved by adding the photo sensitive thin film 330. Besides, as described in above paragraph, the thin film 330 may convert photons otherwise invisible to the P-N junction diode 300 to visible wavelengths, there will be more photons in the incoming light to generate electron-hole pairs, and the light sensitivity of the P-N junction diode 300 is further enhanced.

Here the thickness of the thin oxide 335 can be adjusted to control the tunneling rate for the electron-hole pairs generated by the photoconductive layer 330. For example, the thickness of the thin oxide 335 is preferably thinner than 100 angstroms. One having skills in the art may also recognize other dielectric materials may also be used in place of the thin oxide 335.

As shown in FIG. 3A, in order to assist the generated electrons to tunnel through the thin oxide 335, a bias voltage VP may be applied to the thin film 330. Besides, in a semiconductor manufacturing process, the photo sensitive thin film 300 may be selectively coated with lithograph patterning to cater to various needs.

FIG. 3B shows another embodiment of the present invention with a photo sensitive thin film 360 overlays the N-type region 310. The overlay alters the silicon surface potential, thus allows more carries to be stored in the depletion regions of the P-N junction discharging.

The photo sensitive materials used for the thin film 330 or 360 are usually photoconductive semiconductor slab that generates carriers either by band-to-band transitions (intrinsic) or by transitions involving forbidden-gap energy levels (extrinsic). The photoconductive material may be selected from the group consisted of CdS, PbS, InSb, HgCdTe, GaAs, nickel-doped germanium (Ge—Ni) and phosphorus-doped silicon (Si—P). They can be pure material or in PN junction form with or without bias.

CdS is commonly used as light-sensitive material in discrete devices for wavelength near 0.5 um. The resistance between two terminals of CdS film changes drastically when light shines on the surface. Whereas at 10 um, an HgCdTe photoconductor is preferred. In the wavelength from 100 to 400 um, a GaAs photoconductor is a better choice because of its higher detectivity.

One of the mechanisms to achieve multiple carrier generation is through photoconductivity. When light shines on a photoconductive material, such as Cds, amorphous silicon a-Si:H, etc., electron-hole pairs will be generated accordingly. The photoconductivity $\sigma ph$ is determined by the product of the free-carrier lifetime $\tau$ and free-carrier mobility $\mu$:

$$\sigma ph = q \cdot \mu \cdot \tau \cdot f \qquad (\text{Eq. 1})$$

where f is an average optical generation rate, which is the number of carriers generated by the photons absorbed per second and per unit volume. The $\mu \cdot \tau$ product depends on the property of photoconductive material. In general, the $\mu \cdot \tau$ product depends on the position of Fermi level Ef to the bandgap. The further the Fermi level is away from the midgap and closer to the conduction band edge Ec, the larger the $\mu \cdot \tau$ product. The mobility $\mu$ was found independently of Fermi level, the photoconductivity $\sigma ph$ is therefore proportional to the recombination lifetime $\tau$.

Figure 4A:
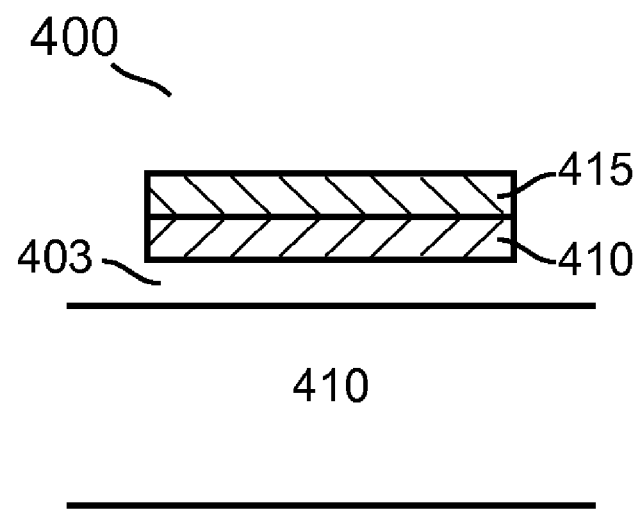
FIGS. 4A~4D are cross-sectional views of alternative photo sensitivity enhancing structures according to other embodiments of the present invention.

FIGS. 4A through 4D are cross-sectional views of alternative photo sensitivity enhancing structures according to other embodiments of the present invention. FIG. 4A illustrates a structure 400 in which addition photon generated electron-hole pairs come from a P-N junction formed by two layers 410 and 415 on top of an insulation layer 403 over a semiconductor substrate 410. If layer 410 is an N-type, then layer 415 is a P-type, or vice versa. Photon generates electron-hole pairs in a depletion region at an interface of layers 410 and 415. Traditional P-N junction is built in the semiconductor substrate 410 under the layers 410 and 415.

Figure 4B:
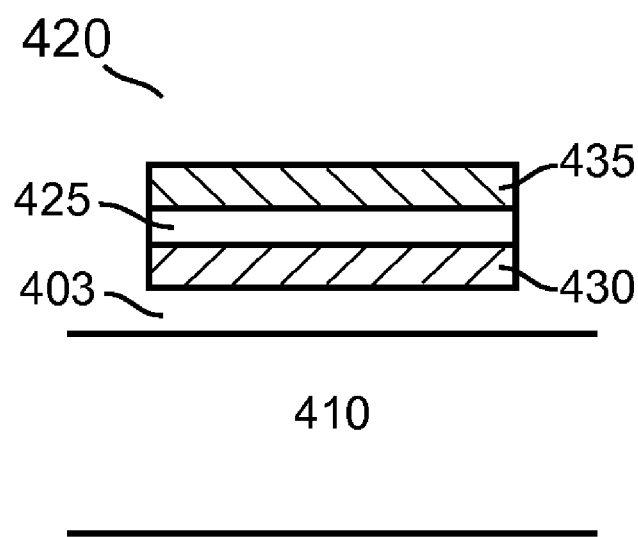

FIG. 4B illustrates a P-Intrinsic-N (P-I-N) structure 420 which is slightly different from the structure 400 in that a thin intrinsic layer 425 is deposited between two doped layers 430 and 435. If layer 430 is an N-type, then layer 435 is a P-type, or vice versa. Here, the depletion region is the intrinsic layer 425, the thickness of which can be tailored to optimize the photo sensitivity.

Figure 4C:
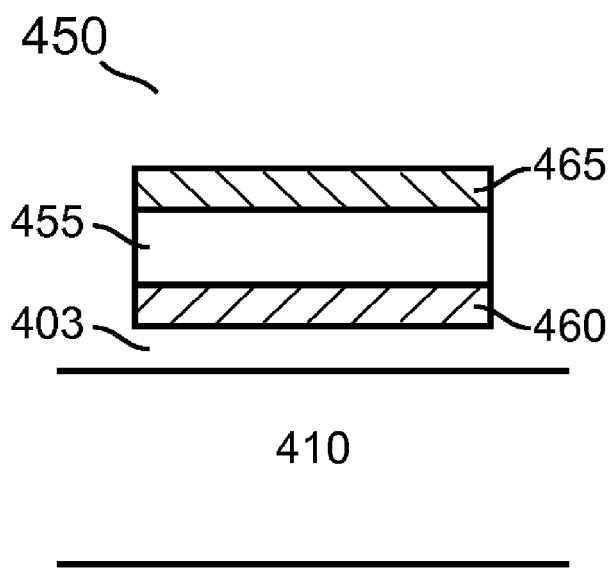

FIG. 4C illustrates a heterojunction structure 450 deposed on top of the insulator 403 over the semiconductor substrate 410 for generating additional electron-hole pairs. As an example, the heterojunction structure 450 comprises an intrinsic semiconductor layer 455 being sandwiched between two semiconductor blocking layers 460 and 465 of different material composition, such as GaAs or GaAsInP. These layers 455, 460 and 465 have non-equal band gaps. The intrinsic semiconductor layer 455 generates electron-hole pairs when light shines on the structure 450. These electrons and holes may tunnel through the thin insulation layer 403 and reach the semiconductor substrate 410.

Figure 4D:
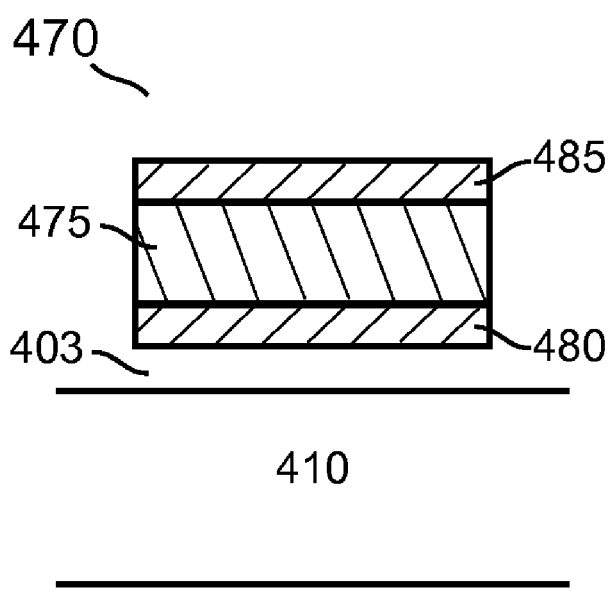

FIG. 4D illustrates a Schottkey barrier formed by a photoconductor layer 475, e.g., a-Si:H, being sandwiched between two layers 480 and 485 biased as electrodes. The electrode layers 480 and 485 provide a Schottkey barrier lowering effect for electron-hole pairs being generated in the photoconductor layer 475 by light. {If this is a Schottkey barrier. Just say so.} Then these electrons and holes may tunnel through the thin insulation layer 403. In all the cases of FIGS. 4A through 4D, the insulation layer 403 has to be thin enough to allow carriers to tunnel through and reach the semiconductor substrate 410 where the conventional P-N junction is formed therein. As a result of these tunneled-in carriers, a combination current in the photosensitive structure 400, 420, 450 or 470 will be larger than in a case that has only the conventional P-N junction.

Figure 2:
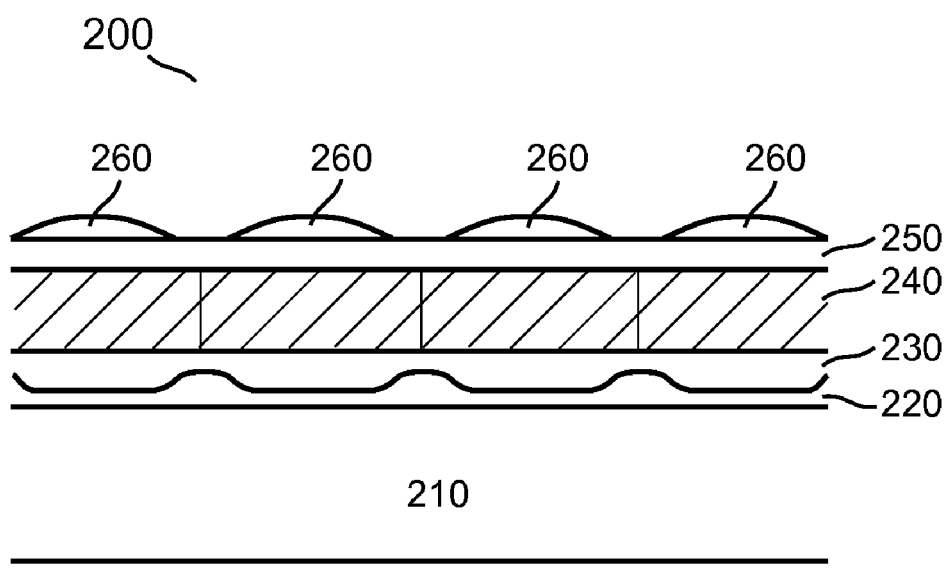
FIG. 2 is a cross-sectional view of such conventional CMOS image sensor cells formed in a semiconductor substrate.
Figure 5A:
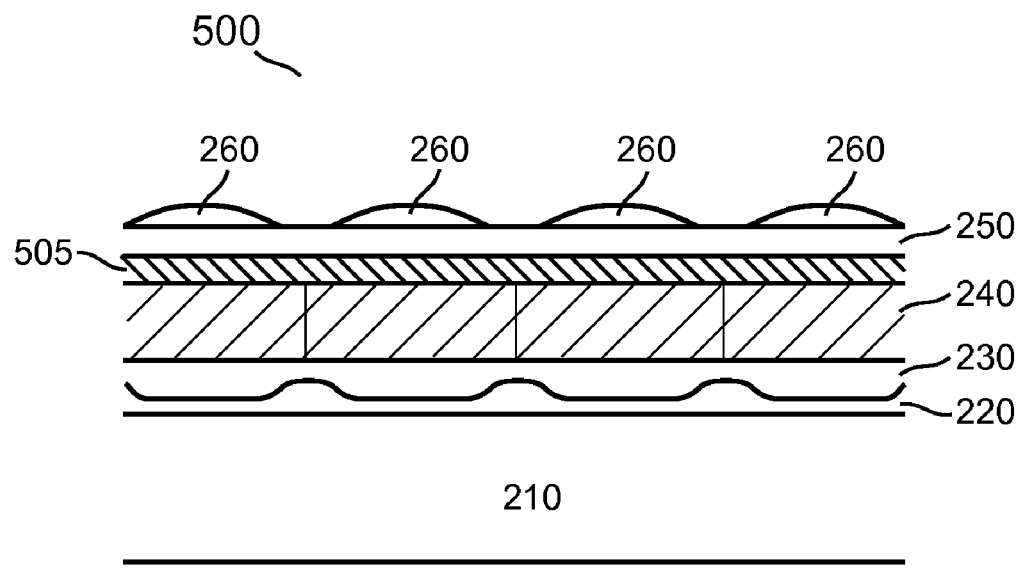
FIGS. 5A through 5B are cross-sectional views of CMOS image sensor cells with photosensitive layers applied according to embodiments of the present invention.
Figure 5B:
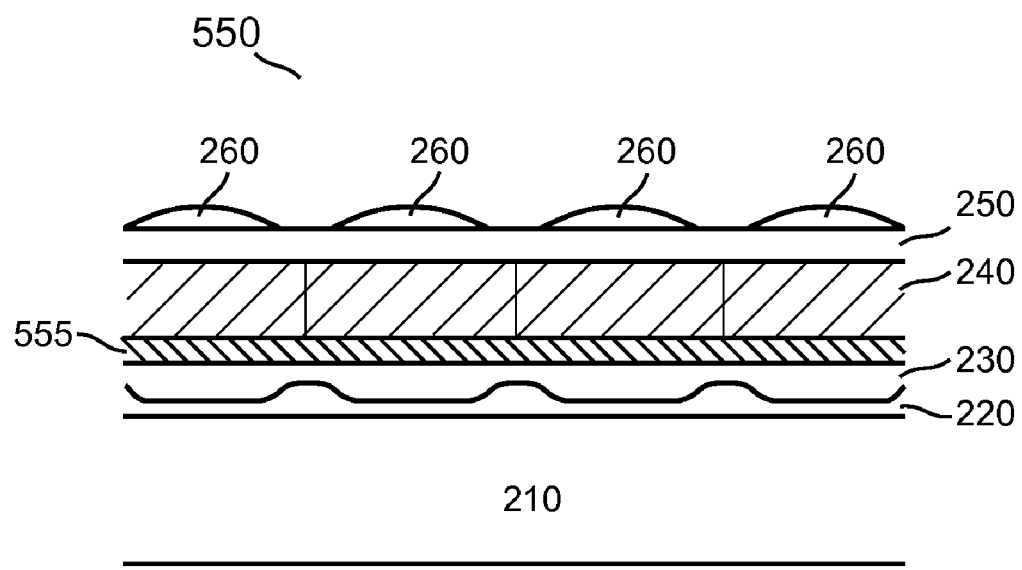

FIGS. 5A and 5B are cross-sectional views of CMOS image sensor cells 500 and 550 with photosensitive layers 505 and 555 applied, respectively, according to embodiments of the present invention. The CMOS image sensor cells 500 and 550 are very similar to the CMOS image sensor cells 200 as shown in FIG. 2, where a conventional P-N junction diode (not shown) is formed in the substrate 210. A passivation layer 220 is applied on the substrate 210. Then a planarization layer 230 is processed on top of the passivation layer 220 to make the semiconductor surface flat for subsequent applications of a color filter 240, a spacer 250 and micro-lenses 260. All these layers 220 through 260 are transparent to light. Referring to FIG. 5A, the photosensitive layer 505 is disposed between the color filter 240 and the spacer 250. Photon generated carriers will have to travel through the color filter 240, the planarization layer 230 and the passivation layer 220 to reach the semiconductor substrate. Referring to FIG. 5B, the photosensitive layer 555 is disposed between the planarization layer 230 and the color filter 240. Photon generated carriers will only have to travel through the planarization layer 230 and the passivation layer 220 to reach the semiconductor substrate 210. The additional carriers that reach the semiconductor substrate 210 will increase the combination current therein and hence the photosensitivity of the CMOS image sensor cells 500 and 550. Thicknesses of the passivation layers 220 and the planarization layer 230 may be used to adjust the sensitivity level of the CMOS image sensor cells 500 and 550.

Although the P-N junction diode is used for collecting the photon generated carriers in above embodiments of the present invention, one having skills in the art would appreciate other types of semiconductor devices may also serve that purpose as long as the device is reverse biased with little or no current of itself, yet, photon generated electrons and holes may combine therein and create a combination current with a magnitude proportional to an incoming photon density.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A photosensitive device comprising:
   a semiconductor substrate;
   at least one reverse biased device formed in the semiconductor substrate; and
   at least one photosensitive layer disposed above the semiconductor substrate and substantially covering the reverse biased device, the photosensitive layer releasing electrons and holes when struck by photons,
   wherein the photon generated electrons and holes reach the reverse biased device and create a first combination current therein when a light shines thereon.

2. The photosensitive device of claim 1, wherein the reverse biased device is a reverse biased P-N junction diode wherein photons also generate electrons and holes and hence a second combination current therein when the light shines thereon.

3. The photosensitive device of claim 1, wherein the at least one photosensitive layer is made of at least one transparent semiconductor material including, but not being limited to, phosphorus-doped silicon, nickel-doped germanium, CdS, PbS, InSb, HgCdTe, and GaAs.

4. The photosensitive device of claim 1 further comprising at least one transparent insulation layer interposed between the semiconductor substrate and the at least one photosensitive layer, the insulation layer is thin enough to allow photon generated electrons and holes to tunnel through.

5. The photosensitive device of claim 1, wherein the at least one photosensitive layer is applied a bias voltage for assisting photon generated electrons or holes to travel into the semiconductor substrate.

6. The photosensitive device of claim 1, wherein the at least one photosensitive layer comprises:
   a first sub-layer doped with at least one N-type dopant; and
   a second sub-layer doped with at least one P-type dopant.

7. The photosensitive device of claim 6 further comprising at least one insulation layer interposed between the first and second sub-layers.

8. The photosensitive device of claim 1, wherein the at least one photosensitive layer comprises an intrinsic semiconductor layer interposed between two blocking layers, the intrinsic semiconductor layer and the two blocking layers form a heterojunction structure.

9. The photosensitive device of claim 1, wherein the at least one photosensitive layer comprises a photoconductive sub-layer interposed between two electrodes.

10. A photosensitive device comprising:
    a semiconductor substrate;
    at least one reverse biased P-N junction diode formed in the semiconductor substrate, the reverse biased P-N junction diode generating electrons and holes when struck by photons; and
    at least one transparent photosensitive layer disposed above the semiconductor substrate and substantially covering the reverse biased P-N junction diode, the photosensitive layer releasing electrons and holes when struck by photons,
    wherein the photon generated electrons and holes in the transparent photosensitive layer reach the reverse biased P-N junction diode and provide a first combination current additional to a second combination current generated by photons in the reverse biased P-N junction.

11. The photosensitive device of claim 10, wherein the transparent photosensitive layer is made of at least one semiconductor material including, but not being limited to, phosphorus-doped silicon, nickel-doped germanium, CdS, PbS, InSb, HgCdTe, and GaAs.

12. The photosensitive device of claim 10 further comprising at least one transparent insulation layer interposed between the semiconductor substrate and the at least one transparent photosensitive layer, the transparent insulation layer is thin enough to allow photon generated electrons and holes to tunnel through.

13. The photosensitive device of claim 10, wherein the at least one transparent photosensitive layer is applied a bias voltage for assisting photon generated electrons or holes to travel into the semiconductor substrate.

14. The photosensitive device of claim 10, wherein the at least one transparent photosensitive layer comprises:
    a first sub-layer doped with at least one N-type dopant; and
    a second sub-layer doped with at least one P-type dopant.

15. The photosensitive device of claim 14 further comprising at least one insulation layer interposed between the first and second sub-layers.

16. The photosensitive device of claim 10, wherein the at least one transparent photosensitive layer comprises an intrinsic semiconductor layer interposed between two blocking layers, the intrinsic semiconductor layer and the two blocking layers form a heterojunction structure.

17. The photosensitive device of claim 10, wherein the at least one transparent photosensitive layer comprises a photoconductive sub-layer interposed between two electrodes.

18. A photosensitive device comprising:
a semiconductor substrate;
at least one reverse biased P-N junction diode formed in the semiconductor substrate, the reverse biased P-N junction diode generating electrons and holes when struck by photons;
at least one transparent photosensitive layer disposed above the semiconductor substrate and substantially covering the reverse biased P-N junction diode, the photosensitive layer releasing electrons and holes when struck by photons; and
at least one transparent insulation layer interposed between the semiconductor substrate and the at least one transparent photosensitive layer, the transparent insulation layer is thin enough to allow photon generated electrons and holes to tunnel through,
wherein the photon generated electrons and holes in the transparent photosensitive layer reach the reverse biased P-N junction diode and provide a first combination current additional to a second combination current generated by photons in the reverse biased P-N junction.

19. The photosensitive device of claim 18, wherein the transparent photosensitive layer is made of at least one semiconductor material including, but not being limited to, phosphorus-doped silicon, nickel-doped germanium, CdS, PbS, InSb, HgCdTe, and GaAs.

20. The photosensitive device of claim 18, wherein the at least one transparent photosensitive layer is applied a bias voltage for assisting photon generated electrons or holes to travel into the semiconductor substrate.

* * * * *